(12) United States Patent
Chen et al.

(10) Patent No.: US 12,250,769 B2
(45) Date of Patent: Mar. 11, 2025

(54) CIRCUIT BOARD AND MANUFACTURING METHOD THEREOF

(71) Applicants: Kuan-Yu Chen, Taoyuan (TW); Hsiao-Lung Lin, New Taipei (TW)

(72) Inventors: Kuan-Yu Chen, Taoyuan (TW); Hsiao-Lung Lin, New Taipei (TW)

(*) Notice: Subject to any disclaimer, the term of this patent is extended or adjusted under 35 U.S.C. 154(b) by 301 days.

(21) Appl. No.: 17/842,796

(22) Filed: Jun. 17, 2022

(65) Prior Publication Data

US 2022/0408563 A1 Dec. 22, 2022

(30) Foreign Application Priority Data

Jun. 18, 2021 (TW) ................. 110122308

(51) Int. Cl.
| | |
|---|---|
| H05K 1/11 | (2006.01) |
| H05K 1/05 | (2006.01) |
| H05K 3/00 | (2006.01) |
| H05K 3/40 | (2006.01) |
| H05K 3/42 | (2006.01) |
| H05K 3/44 | (2006.01) |
| H05K 3/46 | (2006.01) |

(52) U.S. Cl.
CPC ............ H05K 1/115 (2013.01); H05K 1/05 (2013.01); H05K 3/4038 (2013.01); H05K 3/445 (2013.01)

(58) Field of Classification Search
CPC .......... H05K 1/05; H05K 1/115; H05K 1/056; H05K 3/0032; H05K 3/0047; H05K 3/429; H05K 3/4608; H05K 2201/09581
See application file for complete search history.

(56) References Cited

U.S. PATENT DOCUMENTS

| | | | |
|---|---|---|---|
| 7,838,338 B2 | 11/2010 | Shen | |
| 2011/0274877 A1* | 11/2011 | Yu | B32B 37/1009 |
| | | | 156/60 |
| 2012/0247813 A1* | 10/2012 | Ueda | H01L 23/49894 |
| | | | 174/251 |

FOREIGN PATENT DOCUMENTS

| | | |
|---|---|---|
| CN | 102036476 | 4/2011 |
| CN | 104054408 | 9/2014 |
| CN | 105101607 | 11/2015 |
| CN | 111148353 | 5/2020 |
| CN | 112752400 | 5/2021 |
| TW | I232565 | 5/2005 |

(Continued)

OTHER PUBLICATIONS

"Office Action of China Counterpart Application", issued on Aug. 27, 2024, p. 1-p. 6.

Primary Examiner — Hoa C Nguyen
Assistant Examiner — Amol H Patel
(74) Attorney, Agent, or Firm — JCIPRNET

(57) ABSTRACT

A circuit board includes a metal substrate, a resin layer, an insulating layer, and a first conductive structure. The metal substrate has a first through hole, and the first through hole has a first width. A portion of the resin layer is disposed in the first through hole. The resin layer has a second through hole. The second through hole has a second width. The insulating layer is disposed on at least one surface of the metal substrate, and a portion of the insulating layer contacts the resin layer. The first conductive structure is disposed in the second through hole. The first conductive structure penetrates through the metal substrate. The first width is greater than the second width. A manufacturing method of the circuit board is also provided.

4 Claims, 8 Drawing Sheets

(56) References Cited

FOREIGN PATENT DOCUMENTS

| TW | 393517 | 4/2013 |
| TW | 201713177 | 4/2017 |
| TW | 202100653 | 1/2021 |

* cited by examiner

CIRCUIT BOARD AND MANUFACTURING METHOD THEREOF

CROSS-REFERENCE TO RELATED APPLICATION

This application claims the priority benefit of Taiwan application serial no. 110122308, filed on Jun. 18, 2021. The entirety of the above-mentioned patent application is hereby incorporated by reference herein and made a part of this specification.

BACKGROUND

Technical Field

The disclosure relates to a carrier for packaging, and more particularly, to a circuit board and a manufacturing method thereof.

Description of Related Art

With the advancement of manufacturing technology, light emitting diodes (LEDs) have been continuously enhanced through research and development, and their luminous efficiency and brightness are gradually enhanced, thereby expanding and adapting to the needs of various products. However, when the electric power and operating current of the LEDs are increased, the LEDs will generate more heat relatively, so that the LEDs are prone to be overheated, and thus their performance are affected, and even causing the failure of the LEDs.

The current carrier used for LED packaging has poor stability due to the inability to effectively dissipate heat. In addition, the cost of manufacturing a heat dissipation carrier is high. Therefore, how to improve the heat dissipation effect of the carrier with favorable stability in a low-cost manner is an urgent problem to be resolved at present.

SUMMARY

The disclosure provides a circuit board, which has favorable heat dissipation and stability.

The disclosure provides a manufacturing method of a circuit board, which may reduce the manufacturing cost and have good manufacturing yield.

The circuit board of the disclosure includes a metal substrate, a resin layer, an insulating layer, and a first conductive structure. The metal substrate has a first through hole. The first through hole has a first width. A portion of the resin layer is disposed in the second through hole. The second resin layer has a second through hole. The second through hole has a second width. The insulating layer is disposed on at least one surface of the metal substrate. A portion of the insulating layer contacts the resin layer. The first conductive structure is disposed in the second through hole. The first conductive structure penetrates through the metal substrate. The first width is greater than the second width.

The manufacturing method of the circuit board of the disclosure includes the following steps. A metal substrate is provided. The metal substrate is etched to form a first through hole, and the first through hole has a first width. A resin layer is formed in the first through hole. An insulating layer is formed on the resin layer. A conductive layer is formed on the insulating layer. The resin layer, the insulating layer, and the conductive layer are patterned to form a second through hole in the resin layer. The second through hole has a second width. A first conductive structure is formed on the conductive layer and in the second through hole, and the first conductive structure penetrates through the metal substrate. The first width is greater than the second width.

Based on the above, in the circuit board and the manufacturing method thereof according to an embodiment of the disclosure, since the metal substrate may be etched, the first through hole may be formed in the metal substrate without needs of using a designated metal drilling machine. Followingly, a general drilling process may be performed on the resin layer, the insulating layer, and the conductive layer. According to the above disposition manner, the disposition of the conductive structure in the manufacturing process of the circuit board of the embodiment may be completed through forming through holes in two steps, without using an expensive metal drilling machine for the relatively thick metal substrate to complete the disposition of the through holes. Therefore, the manufacturing process may be simplified, manufacturing time may be saved, and manufacturing cost may be reduced. In addition, the resin layer has favorable bonding with the metal substrate, so that the circuit board has good manufacturing yield. Moreover, the metal substrate has favorable heat dissipation characteristic, so the metal heat dissipation carrier and the circuit board have favorable heat dissipation property. When the circuit board is applied to the package of the light emitting diode, the circuit board can effectively provide the heat dissipation effect to the light emitting diode for attaining good stability.

DESCRIPTION OF THE EMBODIMENTS

Figure 1A:
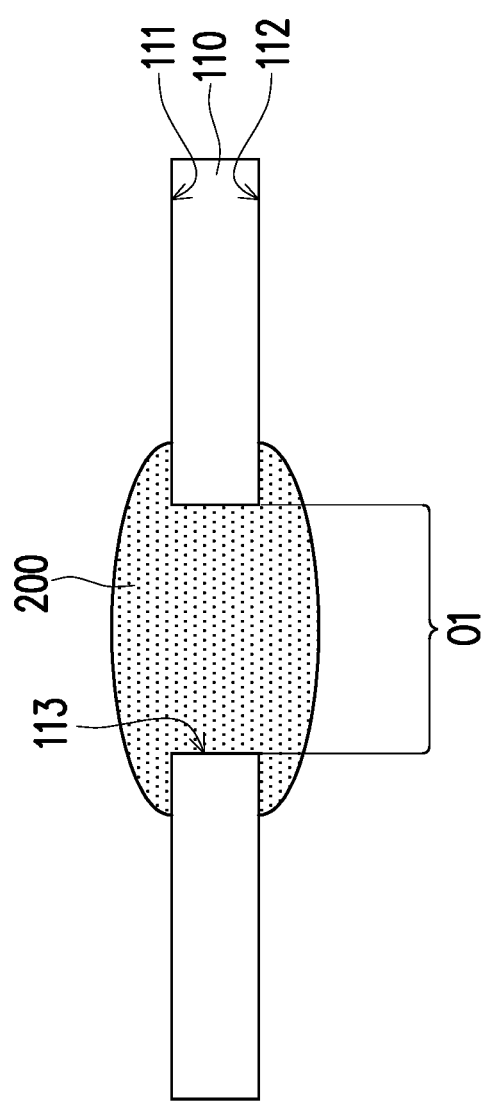
FIGS. 1A to 1D are schematic cross-sectional views of a manufacturing process of a circuit board according to an embodiment of the disclosure.

The disclosure is more fully described with reference to the drawings of the embodiment. However, the disclosure may be embodied in various forms and should not be limited to the embodiments described herein. The thicknesses of layers and regions in the drawings are enlarged for clarity. The same or similar reference numerals denote the same or similar elements, and the repeated descriptions are not repeated in the following paragraphs.

Figure 1B:
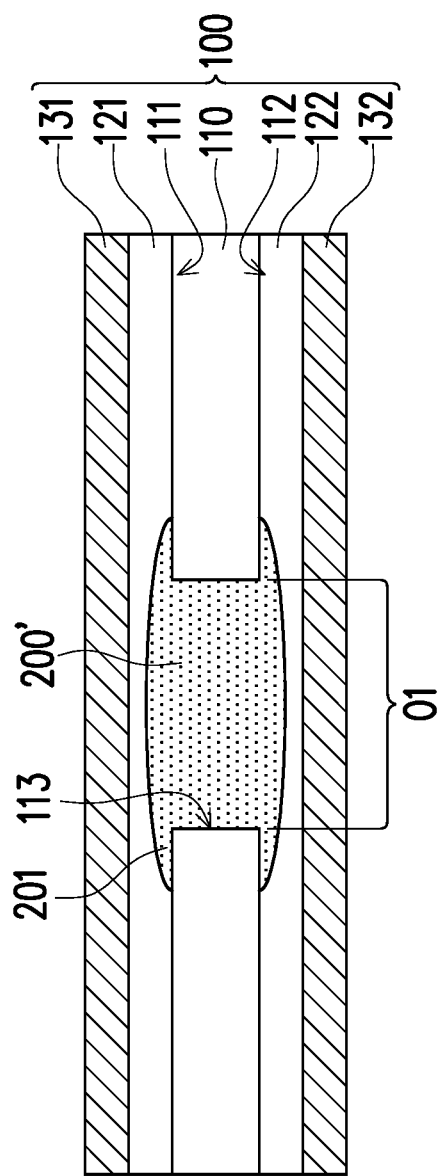
Figure 1C:
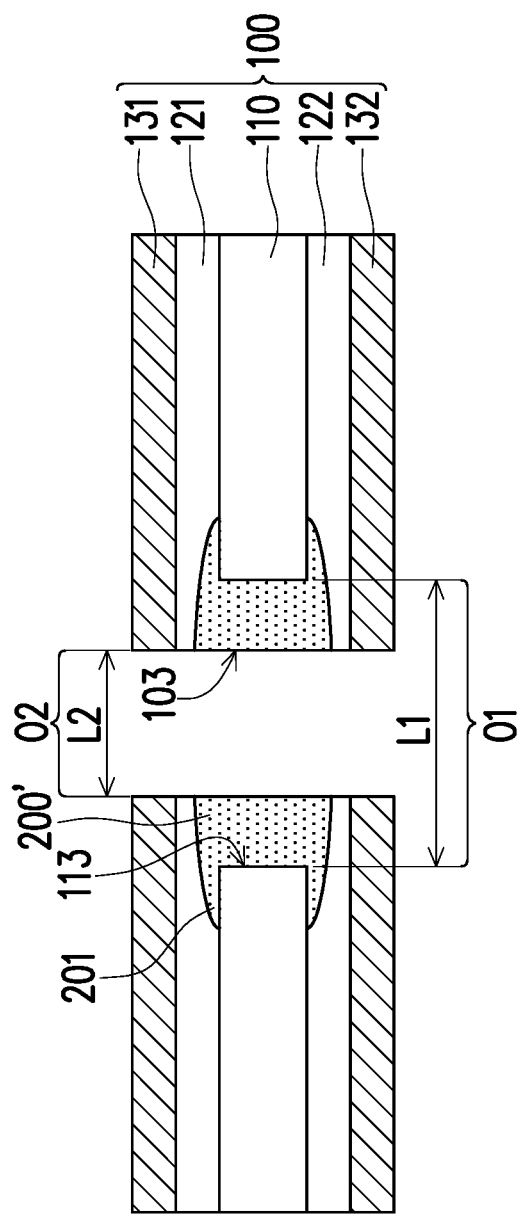
Figure 1D:
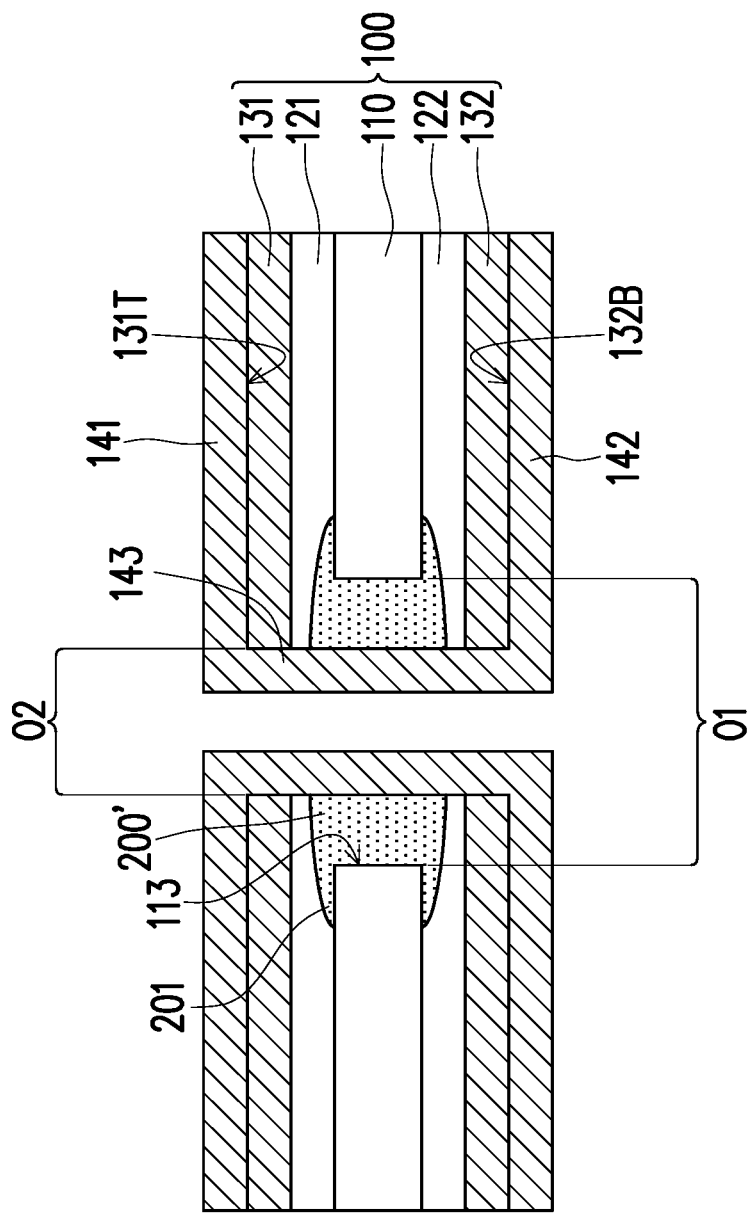

FIGS. 1A to 1D are schematic cross-sectional views of a manufacturing process of a circuit board according to an embodiment of the disclosure. For the clarity of the drawings and the convenience of description, some elements are omitted in FIGS. 1A to 1D. Referring first to FIG. 1D, a circuit board 10 includes a metal substrate 110, a resin layer 200', insulating layers 121 and 122, and a first conductive structure 140. The metal substrate 110 has a first through hole O1. A portion of the resin layer 200' is disposed in the first through hole O1. The resin layer 200' has a second through hole O2. The insulating layers 121 and 122 are disposed on at least one surface of the metal substrate 110. Portions of the insulating layers 121 and 122 are in contact with the resin layer 200'. The first conductive structure 140 is disposed in the second through hole O2, and the first conductive structure 140 penetrates through the metal substrate 110. According to the above disposition manner, the circuit board 10 may be configured as a circuit board with single-sided or double-sided conductive layers, and the heat of the circuit board 10 may be effectively dissipated through the metal substrate 110. In the circuit board 10 of the embodiment, surface-mount technology (SMT) may use be utilized to carry a light emitting diode chip (LED chip), or a suitable packaging technology such as flip chip packaging or wire bonding packaging may be applied, so as to dissipate heat of the circuit board 10 for favorable stability. The above-mentioned LED chip includes a sub-millimeter LED (Mini LED), a micro LED, an organic light emitting diode (OLED), or a quantum dot (QD), but not limited thereto.

Hereinafter, an embodiment of the manufacturing method of the circuit board 10 is briefly described.

Referring to FIG. 1A, the metal substrate 110 is firstly provided. The metal substrate 110 has an upper surface 111 and a lower surface 112 opposite to each other. The material of the metal substrate 110 includes metal or metal alloy, such as aluminum, copper, aluminum alloy, copper alloy, or stainless steel or any material with good thermal conductivity, and the disclosure is not limited thereto. For example, the metal substrate 110 of the embodiment may be a copper plate, an aluminum plate, or a stainless steel plate. In such fashion, the circuit board 10 has good heat dissipation. In addition, the metal substrate 110 may further provide toughness and structural reliability.

In some embodiments, the metal substrate 110 may also be replaced by a glass substrate, a glass fiber substrate (FR-4), a printed circuit board (PCB), or a semiconductor silicon substrate, but the disclosure is not limited thereto. For example, the glass fiber substrate may include the material of glass fiber mixed with epoxy resin, but the disclosure is not limited thereto.

Followingly, the metal substrate 110 is etched to form the first through hole O1. The first through hole O1 has sidewalls 113, which connect the upper surface 111 and the lower surface 112. The first through hole O1 has a first width L1 (as shown in FIG. 1C). In some embodiments, the method of etching the metal substrate 110 includes the following steps. A photoresist is formed on one surface of the metal substrate 110 (e.g., the upper surface 111 or the lower surface 112), and the photoresist is developed to form a mask (not shown). Next, wet etching or dry etching is performed on the metal substrate 110 by using the above-mentioned mask to form the first through hole O1 in the metal substrate 110. The first through hole O1 penetrates through the metal substrate 110.

In other embodiments, laser drilling or die punching may also be performed on the metal substrate 110 to form the first through hole O1.

It should be noted here that the number of the first through holes O1 in the embodiment of the disclosure is not limited to the number of the first through holes O1 shown in FIG. 1. For example, the number of the first through holes O1 may be singular or plural, and the number in the disclosure is not intended to be limited thereto.

Then, the resin layer 200' is formed in the first through hole O1. For example, a resin material layer 200 is firstly disposed on the metal substrate 110 and in the first through hole O1. A portion of the resin material layer 200 may be disposed on at least one surface of the metal substrate 110, for example, on the upper surface 111 or the lower surface 112.

In some embodiments, the material of the resin material layer 200 includes an organic material or an organic polymer material, for example including polyimide (PI), polyamide, polybenzoxazole (PBO), benzocyclobutene (BCB), acrylic, siloxane, silicone, epoxy, a cyclo olefin polymer, other suitable materials, or a combination of the above materials, but is not limited thereto.

Referring to FIG. 1B, the upper surface 111 and the lower surface 112 of the metal substrate 110 or the resin material layer 200 may be subjected to a grinding process or a brushing process, so that the surfaces 111 and 112 of the metal substrate 110 may be flattened or the excess resin material layer 200 may be removed. The grinding process may include a chemical mechanical polishing (CMP) process but is not limited thereto. The brushing process may include ceramic brushing or abrasive belt brushing but is not limited thereto.

After the grinding process, a portion of the resin material layer 200 may be removed to form the resin layer 200' in the first through hole O1. In addition, a portion of the resin layer 200' may be disposed on at least one surface of the metal substrate 110. Specifically, the resin layer 200' has a contact portion 201. The contact portion 201 is disposed on at least one surface of the metal substrate 110. For example, the contact portion 201 is disposed on the upper surface 111, the lower surface 112, or on both surfaces 111 and 112. Based the above disposition manner, the resin layer 200' may increase the contact area with the metal substrate 110 through the contact portion 201. In such fashion, the resin layer 200' may be better bonded to the metal substrate 110, thereby reducing the risk of the resin layer 200' being falling off from a first opening O1.

In some embodiments, the surface of the resin layer 200' may be a curved surface, and the surface of the resin layer 200' is located on the upper surface 111 or the lower surface 112. That is, a portion of the resin layer 200' may be overlapped with the metal substrate 110. In addition, in a normal direction perpendicular to the metal substrate 110, the contour of the first through hole O1 is located in the contour of the resin layer 200', but the present embodiment is not limited thereto.

Moreover, the insulating layers 121 and 122 are formed on the upper surface 111 and the resin layer 200', and formed on the lower surface 112 and the resin layer 200'. In detail, the insulating layer 121 is disposed above the upper surface 112 and the resin layer 200'. The insulating layer 122 is disposed below the lower surface 111 and the resin layer 200'. The insulating layer 121 and the insulating layer 122 are, for example, formed on the upper surface 111 or the lower surface 112 of the metal substrate 110 on the entire surface, but the present embodiment is not limited thereto. In some embodiments, the insulating layer 121 and the insulating layer 122 have flat surfaces, for example, so that the insulating layer 121 and the insulating layer 122 may be applied as flat layers to improve the flatness and reliability of the overall structure.

In some embodiments, the materials of the insulating layer 121 and the insulating layer 122 include insulating materials, such as silicon oxide, silicon nitride, or silicon oxynitride, or other suitable materials or mixtures thereof but are not limited thereto. In other embodiments, the material of the resin layer 200' may be the same as or different from the material of the insulating layer 121 and the insulating layer 122 but is not limited thereto.

In addition, the insulating layer 121 and the insulating layer 122 may be a single layer or a multi-layer stack, which is not limited to the exemplary embodiment shown in FIG. 1B.

In addition, conductive layers 131 and 132 are formed on the insulating layers 121 and 122, respectively. In detail, the conductive layer 131 is disposed above the insulating layer 121. The conductive layer 132 is disposed under the insulating layer 122. The materials of the conductive layer 131 and the conductive layer 132 include conductive materials such as metal or metal alloy (e.g., copper, or copper-aluminum alloy). In other embodiments, the materials of the conductive layer 131 and the conductive layer 132 further include transparent conductive materials, such as indium tin oxide (ITO), zinc oxide (ZnO), aluminum zinc oxide (AlZnO), or gallium zinc oxide (GaZnO) or other suitable transparent conductive materials but are not limited thereto. In some embodiments, the conductive layers 131 and 132 may be a stack of single-layer or multi-layer conductive materials, which is not limited to the exemplary embodiment shown in FIG. 1B.

In some embodiments, the conductive layer 131 and the conductive layer 132 may be copper foils. As shown in FIG. 1B, the metal substrate 110 may be disposed with copper foils (i.e., the conductive layer 131 and the conductive layer 132) on the upper surface 111 and the lower surface 112. Therefore, the metal substrate 110, the resin layer 200', the insulating layers 121 and 122, and the conductive layers 131 and 132 may be applied as a metal heat dissipation carrier 100 of double-sided copper foils but are not limited thereto.

In an unillustrated embodiment, an insulating layer and a conductive layer may also be disposed on either the upper surface or the lower surface of the metal substrate. Based on the above disposition manner, the insulating layer and the conductive layer are sequentially disposed on the upper surface and cover the resin layer. The resin layer is exposed on the lower surface. In such fashion, the metal substrate, the resin layer, the insulating layer, and the conductive layer may be applied as a metal heat dissipation carrier with a single-sided copper foil.

Referring to FIG. 1C, the resin layer 200', the insulating layers 121 and 122, and the conductive layers 131 and 132 are then patterned to form the second through hole O2 in the resin layer 200'. In some embodiments, the first through hole O1 has a first width L1, and the second through hole O2 has a second width L2. The first width L1 is greater than the second width L2.

In detail, the above patterning method includes a drilling process or a cutting process. The drilling process includes, for example, laser drilling process or tool drilling process. For example, the resin layer 200', the insulating layers 121 and 122 and the conductive layers 131 and 132 may be drilled by the laser beams at the positions corresponding to the first through hole O1, so as to drill holes in the resin layer 200', the insulating layers 121 and 122, and the conductive layers 131 and 132 to form openings. In some embodiments, a sidewall 103 of the resin layer 200', the insulating layers 121 and 122, and the conductive layers 131 and 132 may be cut to form a continuous via, which penetrates through the resin layer 200', the insulating layers 121 and 122, and the conductive layers 131 and 132. In other words, the second through hole O2 of the resin layer 200' may further be a via penetrating through the resin layer 200', the insulating layers 121 and 122, and the conductive layers 131 and 132. In some embodiments, the second through hole O2 may further penetrate through the metal substrate 110.

In some embodiments, since the resin layer 200' is located in the first through hole O1, the second through hole O2 located in the resin layer 200' may be located in the first through hole O1. That is, in the direction perpendicular to the normal line of the metal substrate 110, the contour of the second through hole O2 is located within the contour of the first through hole O1. The sidewalls 103 of the second through hole O2 are located between the sidewalls 113 of the first through hole O1.

In some embodiments, the first width L1 is greater than the second width L2. The first width L1 may be defined as the maximum distance between the opposite sidewalls 113 of the first through hole O1. The second width L2 may be defined as the maximum distance between the opposite sidewalls 103 of the second through hole O2. Based on the above-mentioned width ratio, the first opening O1 is not affected when a second opening O2 is formed, so as to provide favorable structural strength and quality.

Referring to FIG. 1D, a first conductive structure 140 is then formed on the conductive layers 131 and 132 and in the second through hole O2. The first conductive structure 140 penetrates through the metal substrate 110. In detail, after the metal heat dissipation carrier 100 is formed, the conductive material may be disposed above the conductive layer 131, below the conductive layer 132, and on the sidewall 103 of the second through hole O2 through the physical vapor deposition (PVD) method, chemical vapor deposition (chemical vapor deposition, CVD) method, or wet electroplating. In such fashion, the first conductive structure 140 is formed on the metal heat dissipation carrier 100. In some embodiments, the material of the first conductive structure 140 includes copper (Cu), chromium (Cr), titanium (Ti), aluminum (Al), aluminum alloy (Alloy Al), aluminum copper alloy (Alloy Al/Cu), silver (Ag), nickel (Ni), palladium (Pd), platinum (Pt), gold (Au) or a combination thereof but is not limited thereto.

Specifically, the first conductive structure 140 has a first wiring layer 141, a third wiring layer 142, and a conductive through hole 143 connected to the first wiring layer 141 and the third wiring layer 142. The first wiring layer 141 is disposed above an upper surface 131T of the conductive layer 131. The third wiring layer 142 is disposed below a lower surface 132B of the conductive layer 132. From another perspective, a portion of the first conductive structure 140 is disposed on the conductive layer 131, and the conductive layer 131 is located between the insulating layer 121 and the portion of the first conductive structure 140. The conductive through hole 143 is disposed on the sidewall 103 of the second through hole O2 and electrically connected to the first wiring layer 141 and the third wiring layer 142. The conductive through hole 143 may penetrate through the metal substrate 110, the resin layer 200', the insulating layers 121 and 122, and the conductive layers 131 and 132. In such fashion, the first conductive structure 140 may electrically connect the lines or circuit elements on the upper surface 111 of the metal substrate 110 to the lines or circuit elements on the lower surface 112 but is not limited thereto.

In some embodiments, the first wiring layer 141 or the third wiring layer 142 may include circuit patterns, conductive pads, and conductive structures penetrating through a dielectric layer but is not limited thereto. In some embodiments, the first wiring layer 141 and the third wiring layer 142 may be a stack of single-layer or multi-layer wiring layers, which is not limited to exemplary embodiment shown in FIG. 1D.

To this step, the fabrication of the circuit board 10 has been substantially completed. In the embodiment, the circuit board 10 may be an encapsulation carrier in which metal foils or wiring layers are provided on the upper and lower surfaces of the metal heat dissipation carrier 100. In other embodiments, an interconnect structure, a redistribution layer or other circuit elements may further be disposed on the upper surface or the lower surface of the circuit board 10 but is not limited thereto.

In an unillustrated embodiment, an insulating layer and a conductive layer may also be disposed on the upper surface of the metal substrate first. Moreover, the metal substrate is etched on the lower surface to form a first opening. Then, a resin material is formed in the lower surface and the first opening. Next, a grinding process is performed on the lower surface and the resin material to form a resin layer. Followingly, an insulating layer and a conductive layer are formed on the lower surface to complete manufacturing process of the metal heat dissipation carrier. The resin layer, the insulating layer, and the conductive layer are then patterned to form a second through hole penetrating through the metal substrate, the resin layer, the insulating layer, and the conductive layer. Moreover, the first conductive structure is disposed on the metal heat dissipation carrier, and the manufacturing process of the circuit board is completed.

In an embodiment of the disclosure, since the metal substrate 110 may be subjected to an etching process first, the first through hole O1 may be formed in the metal substrate 110 without using a designated metal drilling machine. Followingly, a common drilling process may be performed on the resin layer 220', the insulating layers 121 and 122, and the conductive layers 131 and 132. Based the above disposition manner, the circuit board 10 of the embodiment may be fabricated through two steps of forming through holes without using an expensive metal drilling machine for the relative thick metal substrate 110 to accomplish the disposition of the through holes. Therefore, the manufacturing process may be simplified, the manufacturing time may be saved, and the manufacturing cost may be reduced. In addition, the contact portion 201 of the resin layer 220' may be disposed on the upper surface 111 or the lower surface 112 of the metal substrate 110, so that the resin layer 200' may be better bonded to the metal substrate 110, and better manufacturing yield can be achieved through the circuit board 10. Moreover, the metal substrate 110 has favorable heat dissipation, so that the metal heat dissipation carrier 100 and the circuit board 10 have favorable heat dissipation. When the circuit board 10 is applied to the package of the light emitting diode, the circuit board 10 can effectively provide the heat dissipation effect with good stability to the light emitting diode.

It must be noted here that the following embodiments continue to use the element numbers and part of the contents of the previous embodiments. Therefore, the same reference numerals are used to represent the same or similar elements, and reference may be made to the foregoing embodiments for some descriptions that omit the same technical content, which will not be repeated in the following embodiments.

Figure 2:
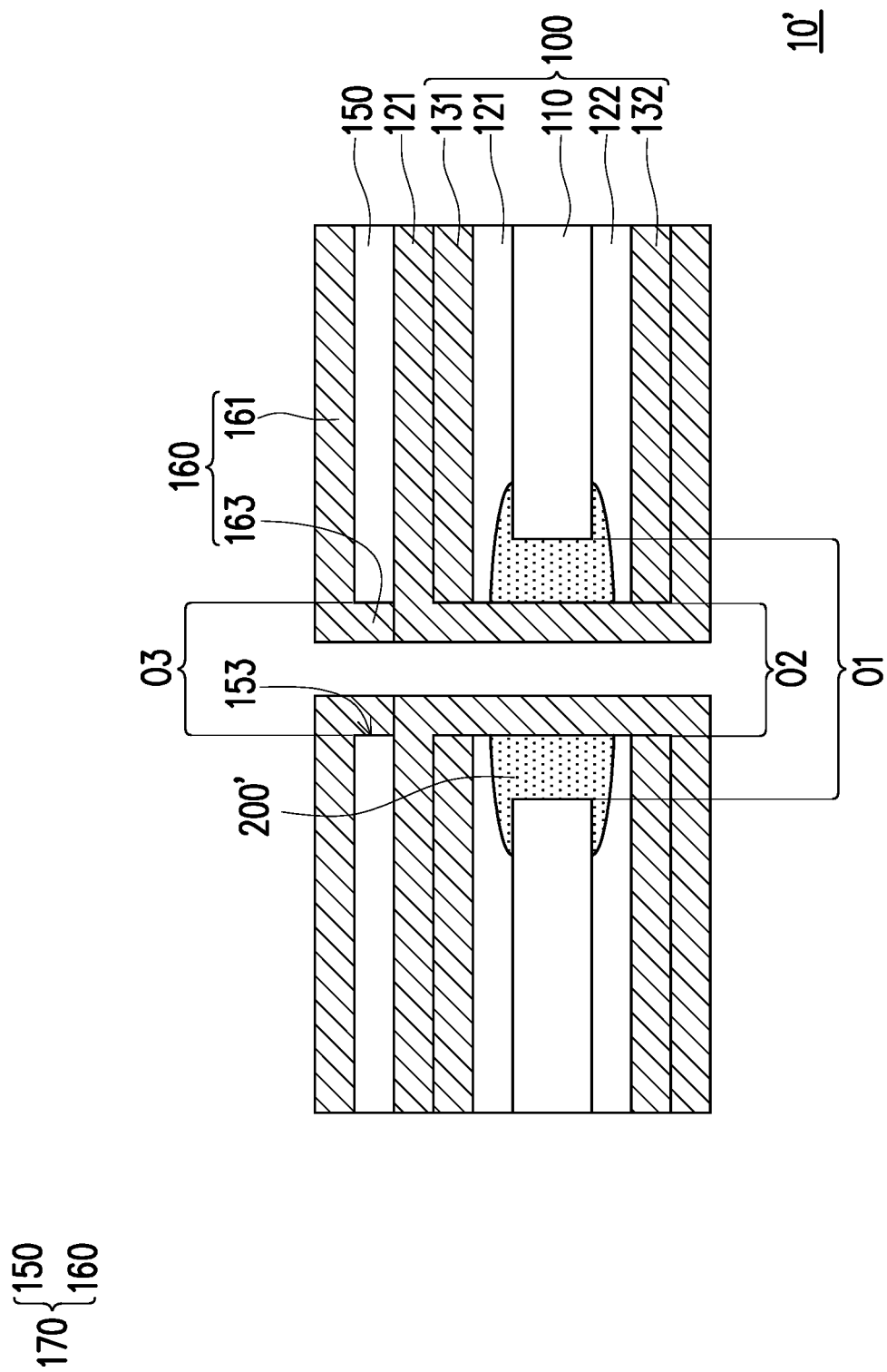
FIG. 2 is a schematic cross-sectional view of a circuit board according to another embodiment of the disclosure.

FIG. 2 is a schematic cross-sectional view of a circuit board according to another embodiment of the disclosure. For the clarity of the drawings and the convenience of description, some elements are omitted in FIG. 2. Referring to FIGS. 1D and 2, a circuit board 10' of the embodiment is similar to the circuit board 10 of FIG. 1D, and the main difference is that the circuit board 10' further includes an interconnect structure 170. In some embodiments, the circuit board 10' is, for example, a multi-layer board stacked with a multi-layer wiring, for example, a three-layer board, but the present embodiment is not limited thereto. In other embodiments, the circuit board may be a four-layer board or more, and the number of wiring layers in the present disclosure is not intended to be limited.

In detail, the interconnect layer 170 is formed on the first conductive structure 140. The step of forming the interconnect layer 170 includes the following steps. A dielectric layer 150 is formed on the first wiring layer 141 of the first conductive structure 140. Next, the dielectric layer 150 is patterned to form a third through hole O3. The above patterning method includes a drilling process or a cutting process. The drilling process includes, for example, laser drilling process or tool drilling process. The third through hole O3 has sidewalls 153. In some embodiments, the second through hole O2 is overlapped with the third through hole O3 in a direction perpendicular to the normal line of the metal substrate 110. The contour of the third through hole O3 may be aligned with the second through hole O2 but is not limited thereto. In some embodiments, the contour of the third through hole O3 may be located inside or outside the contour of the second through hole O2.

In some embodiments, the material of the dielectric layer 150 is similar to the material of the insulating layer 121, and details are not repeatedly described herein.

Next, a second conductive structure 160 is formed above the dielectric layer 150 and in the third through hole O3. The formation method and material of the second conductive structure 160 are similar to those of the first conductive structure 140. Specifically, the second conductive structure 160 has a second wiring layer 161 and a second conductive through hole 163 connected to the second wiring layer 161. The second wiring layer 161 is disposed on the surface of the dielectric layer 151. The second conductive through hole 163 is disposed in the third through hole O3. The second conductive through hole 163 is disposed on the sidewall 153 of the third through hole O3. The second wiring layer 161 is electrically connected to the first conductive structure 140 through the second conductive through hole 163.

In an unillustrated embodiment, more dielectric layers and conductive structures may be disposed on the second conductive structure 160 to form interconnect layers in which multiple circuit layers and dielectric layers are stacked. The above-mentioned circuit layer may further include a conductive structure penetrating through the dielectric layer but is not limited thereto.

To this step, the fabrication of the circuit board 10' has been substantially completed. In such fashion, the circuit board 10' may obtain the same effect as the above-mentioned embodiment.

Figure 3A:
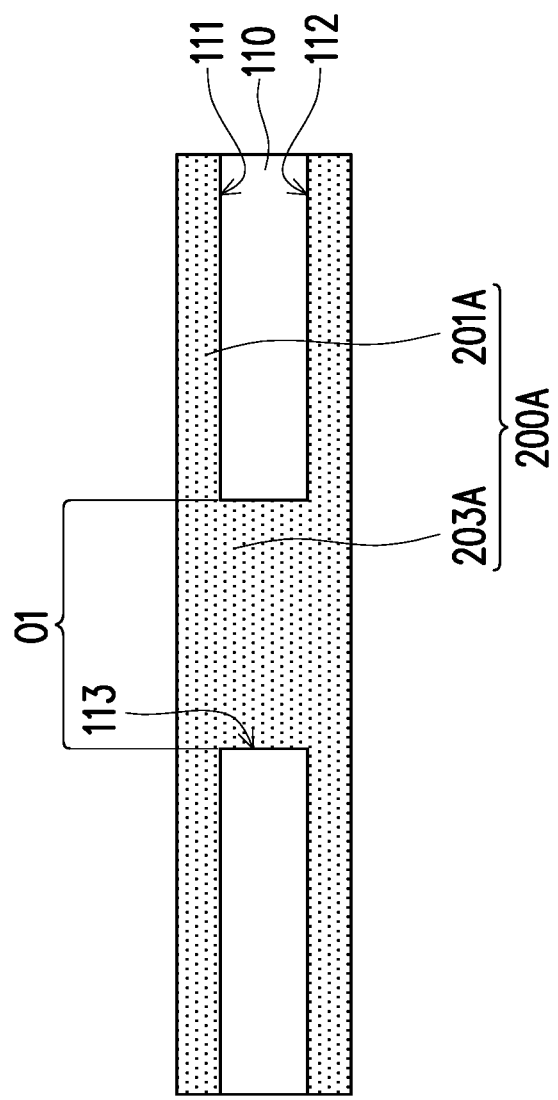
FIGS. 3A to 3B are schematic cross-sectional views of a manufacturing process of a circuit board according to another embodiment of the disclosure.
Figure 3B:
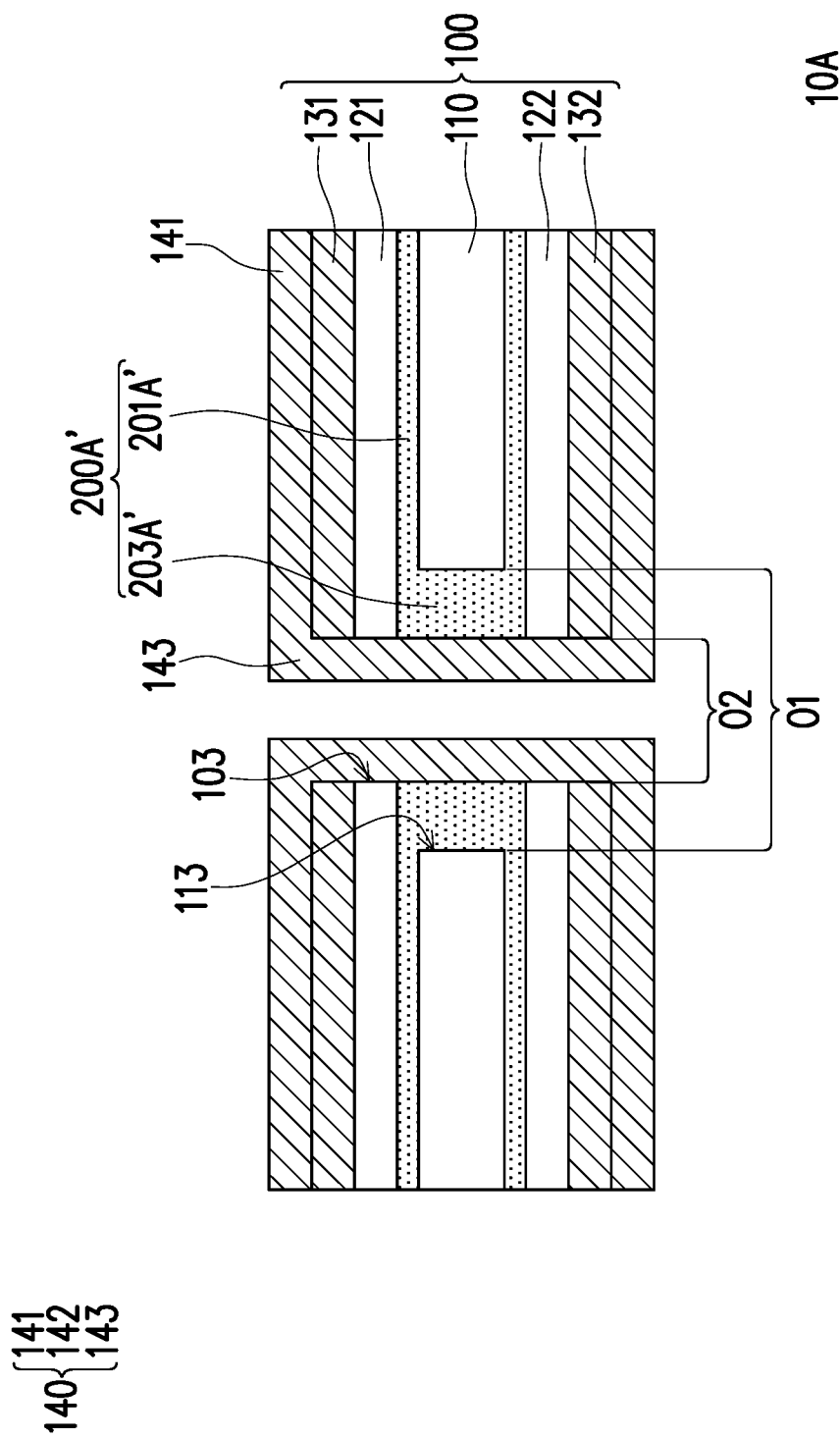

FIGS. 3A to 3B are schematic cross-sectional views of a manufacturing process of a circuit board according to another embodiment of the disclosure. For the clarity of the drawings and the convenience of description, some elements are omitted in FIGS. 3A to 3B. Please refer to FIGS. 1A to 1D and FIGS. 3A to 3B. A circuit board 10A of the embodiment is similar to the circuit board 10 of FIG. 1D, and the main difference is that a contact portion 201A' of a resin layer 200A' may be disposed on the entire upper surface 111 and the lower surface 112 of the metal substrate 110.

Please refer to FIG. 3A. In detail, in the step of forming the resin layer 200A', a resin material layer 200A is formed first. The resin material layer 200A may include a through hole portion 203A disposed in the first through hole O1 and a contact portion 201A connected to the through hole portion 203A. The contact portion 201A is entirely disposed on the upper surface 111 or the lower surface 112 but is not limited thereto.

Referring to FIGS. 3A and 3B, the resin material layer 200A is then subjected to a grinding process to remove a portion of the resin material layer 200 or to thin the resin material layer 200. After the grinding process, the thinned resin material layer 200 may form a resin layer 200' in the first through hole O1 and on the metal substrate 110. Specifically, the contact portion 201A' is disposed on the upper surface 111 and the lower surface 112, and the through hole portion 203A' is disposed in the first through hole O1.

Then, the steps of forming the insulating layers 121 and 122, the conductive layers 131 and 131, and the first conductive structure 140 are sequentially performed to complete the disposition of the circuit board 10A. The above steps have been described in the preceding paragraphs, so that the descriptions are not repeated here.

Figure 3C:
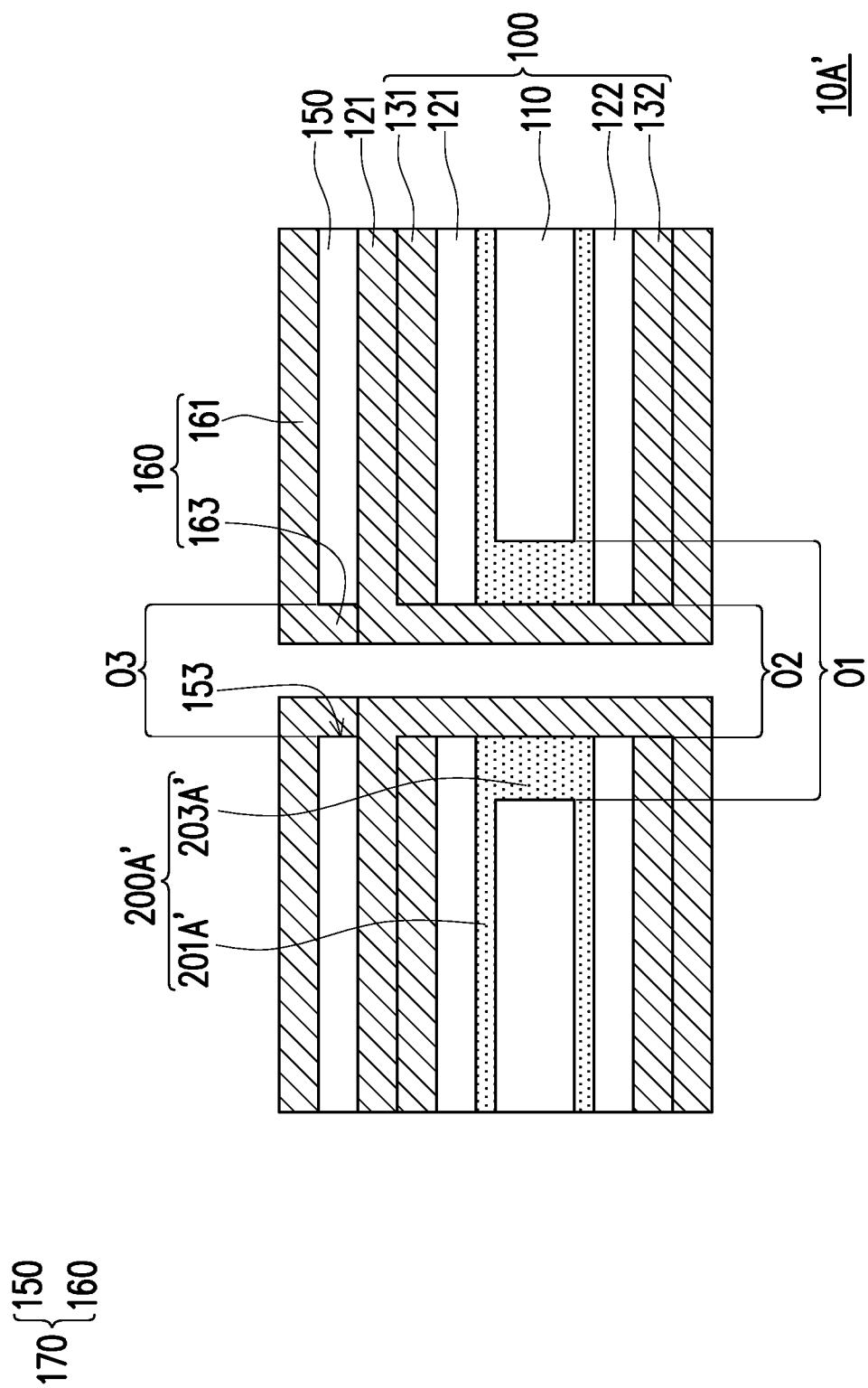
FIG. 3C is a schematic cross-sectional view of a circuit board according to another embodiment of the disclosure.

FIG. 3C is a schematic cross-sectional view of a circuit board according to another embodiment of the disclosure. For the clarity of the drawings and the convenience of description, some elements are omitted in FIG. 3C. Referring to FIGS. 3B and 3C, a circuit board 10A' of the embodiment is similar to the circuit board 10A of FIG. 3B, and the main difference is that the circuit board 10A' further includes an interconnect structure 170. In some embodiments, the circuit board 10A' is, for example, a multi-layer board stacked with multi-layer wiring (e.g., a three-layer board) but is not limited thereto. In other embodiments, the circuit board may be a four-layer board or more, and the disclosure is not intended to limit the number of wiring layers.

Specifically, the interconnect layer 170 is disposed on the first conductive structure 140. The interconnect layer 170 includes the dielectric layer 150 and the second conductive structure 160. The dielectric layer 150 is disposed on the first conductive structure 140. The dielectric layer 150 has the third through hole O3. The third through hole O3 overlaps the second through hole O2.

The second conductive structure 160 is disposed above the dielectric layer 150 and in the third through hole O3. The formation method and material of the second conductive structure 160 are similar to those of the first conductive structure 140. Therefore, the description is not repeated here. The second conductive structure 160 has a second wiring layer 161 and a second conductive through hole 163 connected to the second wiring layer 161. The second wiring layer 161 is disposed on the surface of the dielectric layer 151. The second conductive through hole 163 is disposed in the third through hole O3. The second conductive through hole 163 is disposed on the sidewall 153 of the third through hole O3. The second wiring layer 161 is electrically connected to the first conductive structure 140 through the second conductive through hole 163. The circuit board 10A' may obtain the same effect as the above-mentioned embodiment.

Figure 4:
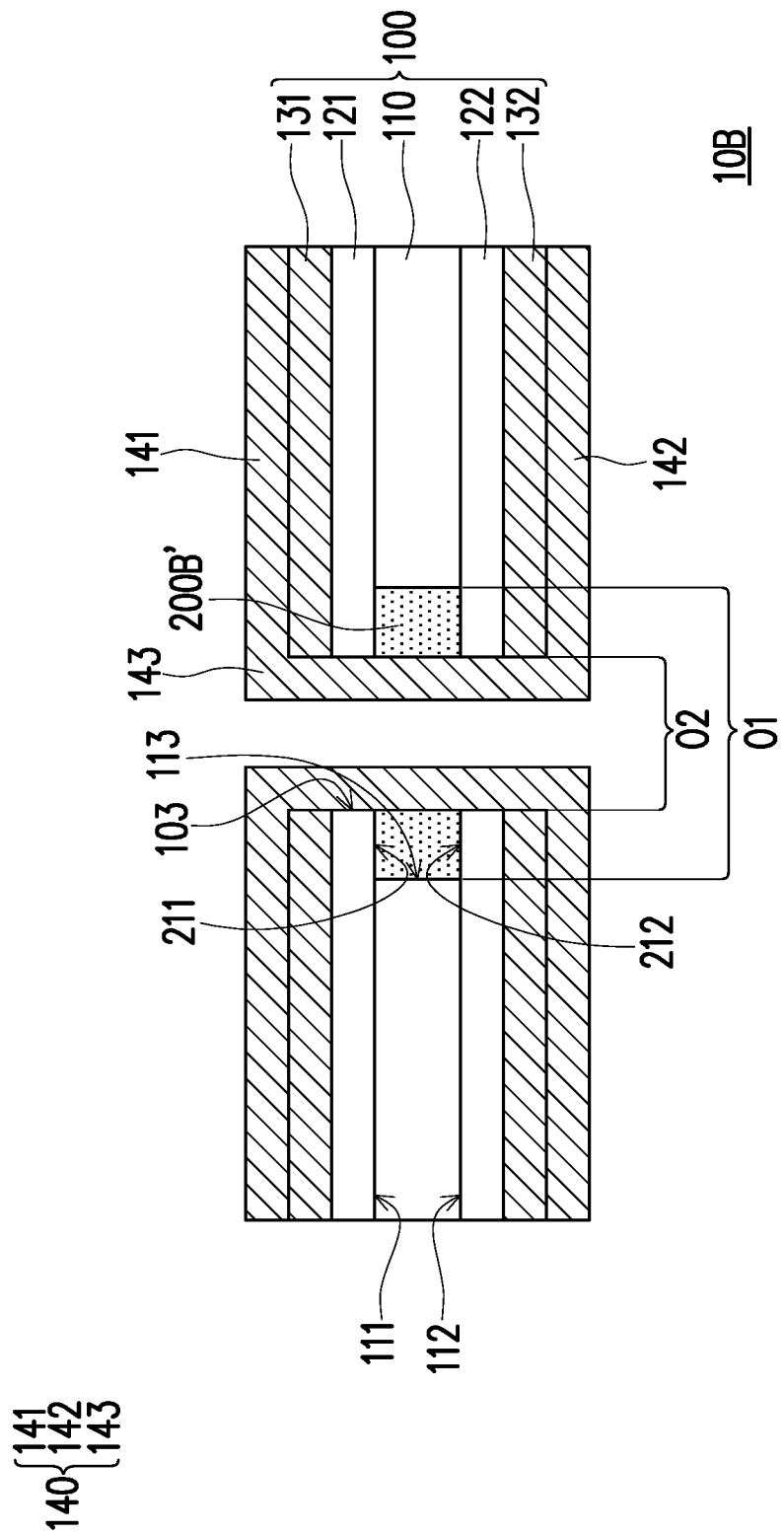
FIG. 4 is a schematic cross-sectional view of a circuit board according to still another embodiment of the disclosure.

FIG. 4 is a schematic cross-sectional view of a circuit board according to still another embodiment of the disclosure. For the clarity of the drawings and the convenience of description, some elements are omitted in FIG. 4. Referring to FIG. 4 and FIG. 1D, a circuit board 10B of the present embodiment is similar to the circuit board 10 of FIG. 1D, and the main difference is that a resin layer 200B' is disposed in the first through hole O1. The resin layer 200B' does not overlap with the metal substrate 110. In addition, surfaces 211 and 212 of the resin layer 200B' are flush with the upper surface 111 and the lower surface 112 of the metal substrate 110.

In detail, in the grinding process in the step of forming the resin layer 20013', the resin material layer may be ground to remove the resin material layer disposed on the upper surface 111 or the lower surface 112 of the metal substrate 110. In this way, the upper surface 211 of the resin layer 200B' formed after grinding is flush with the upper surface 111 of the metal substrate 110. The lower surface 212 of the resin layer 200B' is flush with the lower surface 112 of the metal substrate 110. Based on the above disposition manner, the metal heat dissipation carrier 100 or the circuit board 10B may be further thinned and thus has good heat dissipation and stability. In addition, the circuit board 10B may have excellent quality of being light and thin.

In summary, in the circuit board and the manufacturing method thereof according to an embodiment of the disclosure, since the metal substrate may be etched, the first through hole may be formed in the metal substrate without using a designated metal drilling machine. Next, a general drilling process may be performed on the resin layer, the insulating layer, and the conductive layer. According to the above disposition manner, the disposition of the conductive structure in the circuit board of the embodiment may be completed through two steps of forming through holes, without using an expensive metal drilling machine for the relative thick metal substrate to complete the disposition of the through holes. Therefore, the manufacturing process may be simplified, the manufacturing time may be saved, and manufacturing cost may be reduced. In addition, the resin layer has favorable bonding with the metal substrate, so that good manufacturing yield can be obtained through the circuit board. Moreover, the metal substrate has good heat dissipation, so the metal heat dissipation carrier and the circuit board have good heat dissipation. When the circuit board is applied to the package of the light emitting diode, the circuit board can effectively provide the heat dissipation effect with good stability to the light emitting diode.

What is claimed is:

1. A circuit board, comprising:
   a metal substrate, having a first through hole, and the first through hole having a first width;
   a resin layer, and a portion of the resin layer disposed in the first through hole, wherein the resin layer has a second through hole, and the second through hole has a second width;
   an insulating layer, disposed on at least one surface of the metal substrate, and a portion of the insulating layer contacting the resin layer;
   a first conductive structure, disposed in the second through hole, and the first conductive structure penetrating through the metal substrate, wherein the first width is greater than the second width; and
   a conductive layer, disposed on the insulating layer, wherein the first conductive structure is disposed on the conductive layer, and the conductive layer is located between the insulating layer and the first conductive structure.

2. The circuit board according to claim 1, wherein the resin layer further has a contact portion, and the contact portion is disposed on the at least one surface of the metal substrate.

3. The circuit board according to claim 1, wherein the first conductive structure has a first wiring layer and a first conductive through hole connected to the first wiring layer, the first wiring layer is disposed on the insulating layer, and the first conductive through hole is disposed in the second through hole.

4. The circuit board according to claim 1, further comprising an interconnect layer, disposed on the metal substrate, the interconnect layer comprising:

a dielectric layer, disposed on the first conductive structure, and the dielectric layer having a third through hole; and a second conductive structure, the second conductive structure having a second wiring layer and a second conductive through hole connected to the second wiring layer, the second wiring layer disposed on the dielectric layer, and the second conductive through hole disposed in the third through hole, wherein the second conductive structure is electrically connected to the first conductive structure through the second conductive through hole.

\* \* \* \* \*